US006053989A

United States Patent [19]

Orillion et al.

[11] Patent Number: 6,053,989

[45] Date of Patent: Apr. 25, 2000

[54] AMORPHOUS AND AMORPHOUS/ MICROCRYSTALLINE METAL ALLOYS AND METHODS FOR THEIR PRODUCTION

[75] Inventors: Michael Orillion, San Jose, Calif.; Johan Pfeiffer, Houston, Tex.; Yulig K. Kovneristy, Moscow, Russian Federation

[73] Assignee: FMC Corporation, Philadelphia, Pa.

[21] Appl. No.: 09/023,011

[22] Filed: Feb. 12, 1998

Related U.S. Application Data

[60] Provisional application No. 60/039,386, Feb. 27, 1997.

[51] Int. Cl.[7] .............................. C22C 38/24; H10F 1/04

[52] U.S. Cl. .......................... 148/304; 148/307; 148/121; 148/122

[58] Field of Search .................................... 148/304, 307, 148/121, 122

[56] References Cited

U.S. PATENT DOCUMENTS

| | | | |
|---|---|---|---|
| Re. 32,925 | 5/1989 | Chen et al. . | |
| 1,690,352 | 11/1928 | Williams . | |
| 3,856,513 | 12/1974 | Chen et al. . | |
| 4,116,682 | 9/1978 | Polk et al. . | |
| 4,152,179 | 5/1979 | Falkowski et al. . | |
| 4,197,146 | 4/1980 | Frischmann . | |
| 4,400,208 | 8/1983 | Ackermann . | |
| 4,495,487 | 1/1985 | Kavesh et al. . | |
| 4,581,080 | 4/1986 | Meguro et al. . | |
| 4,584,034 | 4/1986 | Hagiwara et al. . | |
| 4,985,089 | 1/1991 | Yoshizawa et al. . | |
| 5,041,170 | 8/1991 | Ames et al. . | |
| 5,069,731 | 12/1991 | Yoshizawa et al. . | |
| 5,160,379 | 11/1992 | Yoshizawa et al. . | |
| 5,178,689 | 1/1993 | Okamura et al. . | |
| 5,225,006 | 7/1993 | Sawa et al. . | |
| 5,334,262 | 8/1994 | Sawa et al. ............................ | 148/121 |
| 5,449,419 | 9/1995 | Suzuki et al. . | |
| 5,474,624 | 12/1995 | Suzuki et al. . | |
| 5,518,518 | 5/1996 | Blum et al. . | |
| 5,547,487 | 8/1996 | Blum et al. . | |

FOREIGN PATENT DOCUMENTS

| | | | |
|---|---|---|---|
| 0 059 864 | 9/1982 | European Pat. Off. . | |
| 3435519 | 4/1985 | Germany ............................... | 148/304 |
| 3435519 A1 | 4/1985 | Germany . | |
| 58-3203 | of 1983 | Japan . | |
| 62-179704 | 8/1987 | Japan .................................... | 148/304 |

OTHER PUBLICATIONS

Patent Abstracts of Japan, vol. 16, No. 049 (C–0908), Feb. 7, 1992, Jap. Public. No. 03–253545.

Fujii, et al., "Magnetic properties of fine crystalline Fe–P–C––Cu–X alloys," *J. Appl. Phys.* 70(10) pp. 6241–6243, Nov. 15, 1991.

Inoue, A and J.S. Gook, "Effect of Additional Elements (M) on the Thermal Stability of Supercooled Liquid in $Fe_{72-x}A_5Ga_2P_{11}C_6B_4M_x$ Glassy Alloys," *Materials Transactions*, JIM, vol. 37, No. 1, pp. 32–38, 1996.

Inoue, et al., "Thermal and Magnetic Properties of Bulk Fe–Based Glassy Alloys Prepared by Copper Mold Casting," *Materials Transactions*, JIM, vol. 36, No. 12, pp. 1427–1433, 1995.

Yoshizawa, et al., "New Fe–based soft magnetic alloys composed of ultrafine grain structure," *J. Appl. Phys.*, 64(10), pp. 6044–6046, Nov. 15, 1988.

*Primary Examiner*—Deborah Yee
*Attorney, Agent, or Firm*—Gloria L. Norberg; Jose R. Matos; Patrick C. Baker

[57] ABSTRACT

The present invention provides an amorphous or amorphous/ microcrystalline metal alloy comprising $Fe_aCr_bV_cP_dSi_eC_fM_gX_h$ wherein M is selected from the group consisting of Cu, Ni, and mixtures thereof; X is selected from the group consisting of Mo, W, and mixtures thereof; a is about 66 to about 80; b is about 0.5 to about 5.0; c is about 0.5 to about 5.0; d is about 7.0 to about 13.0; e is about 0.2 to about 3.0; f is about 4.5 to about 8.0; g is about 0.1 to about 0.9; h is about 0.1 to about 3.0; and a, b, c, d, e, f, g, and h represent atomic percent where the total is nominally equal to 100 atomic percent. Such metal alloys have desirable magnetic properties such as high saturation induction, low coercivity and high normal permeability. Significantly cost-effective methods of producing such alloys using by-product ferrophosphorus from phosphorus production and impure sources of alloying elements are also provided.

35 Claims, No Drawings

AMORPHOUS AND AMORPHOUS/ MICROCRYSTALLINE METAL ALLOYS AND METHODS FOR THEIR PRODUCTION

The present application claims priority to provisional patent application U.S. Ser. No. 60/039,386, filed Feb. 27, 1997.

TECHNICAL FIELD

The present invention relates generally to the fields of amorphous and amorphous/microcrystalline metal alloys and methods for their production. More particularly, it concerns such particular alloys having desirable magnetic properties such as high saturation induction, low coercivity and high maximum permeability. Significantly cost-effective methods of producing such alloys using by-product ferrophosphorus from phosphorus production and impure sources of alloying elements are also provided.

BACKGROUND

Iron-based amorphous metal alloys and amorphous/microcrystalline metal alloys such as Fe—P—C, Fe—Si—B, Fe—Zr, Fe—Zr—B, and Fe—Cu—Nb—Si—B are well known in the art. To obtain the amorphous state, a molten alloy of a suitable composition is quenched rapidly, or a deposition technique is used. An amorphous state is distinguished from a crystalline state by the absence of an ordered atomic arrangement. In general, the amorphous state will convert upon heating to a crystalline state with initial crystals nucleated having a fine structure of a bcc (body-centered cubic) Fe solid solution, and upon further heating to a sufficiently high temperature, the entire system will crystallize.

Nanocrystalline materials and methods for producing them from iron-based amorphous metals with boron metalloid chemistry are exemplified by U.S. Pat. Nos. 5,474,624 and 5,449,419 to K. Suzuki, et al.; U.S. Pat. Nos. 5,160,379, 5,069,731 and 4,985,089 to Y. Yoshizawa, et al.; and by Yoshizawa et al. (*J Appl. Phys.* 64(10), Nov. 15, 1988). Soft magnetic properties were reported by adding copper and niobium to iron-silicon-boron alloys. Such material currently has the name FINEMET® and reportedly has an ultrafine grain structure composed of bcc Fe solid solution. Desirable properties of FINEMET® are attributed to the bcc solid phase which contains boron and silicon. The general starting ingredients for producing such material, for example, technical ferroboron, niobium or ferroniobium, zirconium and copper are refined or semi-refined products and are quite expensive. In some cases, copper and niobium are added to the starting melts prior to quenching to an amorphous state at levels of 0.2–4.0 atomic percent each. Copper and niobium will form a molecular cluster that aids in the nucleation and control of the size of ferrite iron crystals, however, these materials, especially niobium, are very expensive and are a major drawback to further commercialization of these boron-stabilized nanocrystalline materials.

Typically, amorphous metal alloys are produced by the very rapid cooling of a liquid metal alloy at approximately $10^6$ °C./second. The rapid cooling rate is required for the maintenance of the non-crystalline structure of the liquid alloy when it solidifies. Numerous methods are known for achieving this rapid cooling. One such technique employs rapid cooling at a moving cooled surface, such as a wheel or belt to produce thin wire strands, ribbons or other thin shapes. The thin structure may be laminated or wound to form a magnetic core, for example.

Allied Signal's METGLAS® amorphous metal alloy is an industry standard having a thickness of from 20–23 microns. U.S. Res. Pat. No. 32,925 to Chen et al. relates to amorphous metals and amorphous metal articles having up to one-quarter of the metal replaced by elements such as Mo, W, and Cu, and where wires, for example, may be rendered partially crystalline because the quenching rate is lower than that required to obtain the totally amorphous state for the composition quenched. This material has an amorphous outer surface and a more crystalline inner area and is not amorphous or microcrystalline throughout.

A follow-up heat treatment is often used to relieve internal stresses in the material and should be performed at a temperature that does not result in significant overheating of the alloy. Otherwise, upon heating, the tendency of metals to crystallize will result in the loss of the amorphous structure of the alloy.

Inoue and Gook (*Materials Transactions,* JIM, 37(1), 32–38, 1996) relate to Fe-based glassy alloys having a wide supercooled liquid region before crystallization. Inoue et al. (*Materials Transations,* JIM, 36(12) 1427–1433, 1995) relate to bulk Fe-based glassy alloys prepared by copper mold casting in cylindrical form with diameters of 0.5 and 1.0 mm. Such materials lack the low coercivity and high permeability of compositions of the present invention.

Fujii et al. (*J.AppL. Phys.* 70(10), Nov. 15, 1991) relates to magnetic properties of fine crystalline Fe—P—C—Cu—X alloys. Copper is cited as the essential element for the precipitation of the bcc Fe phase in Fe—P—C as well as Fe—Si—B amorphous alloys. Further, the P concentration is cited as controlling the structure and soft magnetic properties.

U.S. Pat. Nos. 5,518,518 and 5,547,487 relate to the production of amorphous metal alloys from impure by-products of the electric furnace process for manufacturing elemental phosphorus. The by-product FERROPHOS® iron phosphide, sold by FMC Corporation, was employed as a source of iron, phosphorus, chromium, and vanadium while additional iron was included for desired electromagnetic properties of the alloy. In spite of the additional iron, however, a magnetic saturation induction of only 9000 gauss or 0.9 tesla, and an ultimate tensile strength of 1250 Mpa were obtained. These values are insufficient for alloys suitable for use in electrical appliances such as transformer cores, motors, or other devices that require excellent ferromagnetic properties.

No practical guideline is known for predicting with certainty which of the multitude of different possible alloys will yield an amorphous metal alloy or amorphous/microcrystalline metal alloy having desired ferromagnetic properties.

The present invention provides amorphous metal alloys and amorphous/microcrystalline metal alloys having improved magnetic properties. The improved properties are a function of the particular elements and ratios of elements used in the amorphous metal alloys and careful attention to the time and temperature of heating an amorphous metal alloy to form an amorphous/microcrystalline alloy.

DISCLOSURE OF THE INVENTION

The present invention provides amorphous or amorphous/microcrystalline metal alloys of ferrophosphorus and a method for making the alloys on an extraordinarily cost-effective basis because the starting materials for the alloys do not have to be pure ingredients. The alloys described herein possess improved magnetic properties such as high saturation induction, low coercivity, and high maximum permeability as described below, improved castability, improved thickness, and improved physical and mechanical properties. Alloys are produced by the careful alloying and control of the chemistry in the precursor molten melt, rapid solidification to an amorphous state using various melt spinning techniques in an inert atmosphere to cool the melt to below its vitrification temperature. A carefully controlled heat treatment in air, in an inert atmosphere, or under a thermal transfer fluid, within time and temperature limits, to achieve a partial crystalline state with ultra small crystals of ferrite iron within an otherwise amorphous structure provides even further enhanced electromagnetic properties.

An amorphous metal alloy comprising $Fe_aCr_bV_cP_dSi_eC_fM_gX_h$ is an aspect of the present invention wherein:

M is selected from the group consisting of Cu, Ni, and mixtures thereof,

X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent based on the IUPAC standard using carbon-12 which standard is used throughout this application. The atomic weight percent is based on the sum of the listed ingredients and the term nominal 100 atomic percent is used since the alloy can also contain trace amounts, such as up to about 0.5%, of other materials, such as aluminum and/or the transition metal elements: titanium, indium, arsenic, antimony, germanium, and/or beryllium.

In a preferred aspect of the above-described composition, a is about 74 to about 80, b is about 0.5 to about 3.0, c is about 0.5 to about 3.0, d is about 9.0 to about 12.0, and h is about 0.1 to about 0.9 atomic percent.

A further embodiment of the present invention is an above-described composition further comprising boron at about 0.1 to about 4.0 atomic percent and a, b, c, d, e, f, g, h, and the amount of boron present total is nominally equal to 100 atomic percent.

An amorphous/microcrystalline metal alloy formed by heat-treating an above-described amorphous metal alloy at a temperature between $T_{C\ ALLOY}$ and $T_{C\ FERRITE}$ for a period of time sufficient to condition the alloy is a further aspect of the present invention.

A process of producing an amorphous metal alloy using ferrophosphorus produced in a phosphorus-producing electric furnace is another embodiment of the present invention. The process comprises melting the ferrophosphorus with a source of iron, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_h$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent; treating the molten alloy to a separation step to remove insoluble slag formed in the molten alloy, and rapidly cooling the molten alloy to convert the molten alloy into an amorphous metal alloy. In a particularly preferred embodiment, the amorphous metal alloy is heat-treated at a temperature between $T_{C\ ALLOY}$ and $T_{C\ FERRITE}$ for a period of time sufficient to condition the alloy to form an amorphous/microcrystalline metal alloy. Preferably, a is about 74 to about 80, b is about 0.5 to about 3.0, c is about 0.5 to about 3.0, d is about 9.0 to about 12.0, and h is about 0.1 to about 0.9 atomic percent.

The heat treatment that forms nanocrystals of ferrite iron results in improved magnetic properties with very low residual magnetism. The magnetostriction (the tendency to change size in a magnetic field) of the alloyed heat-treated amorphous material can be much less than the magnetostriction of the original, non heat-treated, amorphous alloy. The heat-treated alloy is suitable for use in magnetic chokes and other applications that normally use ferrites, however the heat-treated alloy enables smaller chokes since the alloy has higher flux density than ferrite.

An article of manufacture comprising an amorphous/microcrystalline metal alloy of the present invention is considered an aspect of the present invention. An article of manufacture would require a magnetic device and may include, but is not limited to, an electric appliance, anti-theft tag, transformer core, distribution transformer, motor, choke, magnetic switching device, saturable reactor, a sensor, or other device that requires ferromagnetic properties.

Alloys of the present invention provide the capability of having a ribbon or wire thickness that is greater than what is normally available in the industry. The industry standard is METGLAS®, an amorphous metal alloy product of Allied Signal, which has a thickness of from 20 to 23 microns. Alloys of the present invention can be made into thicker strips of up to 35 microns. For transformers, this increased thickness is desirable. Even greater thickness is expected to be achieved using enhanced fabrication techniques such as a double chill block.

Starting materials for the production of amorphous metal alloys may include refined metals, commercial metal alloys, semi-refined materials such as ferroboron, ferrophosphorus, ferrochromium, cast iron, ferrosilicon, with copper and molybdenum added from any source. Although the alloys can be produced from chemically pure source materials, it has been found that good quality alloys can be produced using, as starting material, the ferrophosphorus by-product produced during the manufacture of phosphorus in an electric furnace. In addition, other materials can be used in place of pure ingredients. Some of these include cast iron (for carbon and iron), ferromolybdenum (for molybdenum and iron), and ferrosilicon (for iron and silicon). Niobium and tantalum are not needed for this process. Satisfactory materials may be produced from products such as a ferrophosphorus as described in U.S. Pat. No. 5,518,518, incorporated by reference herein.

By "amorphous metal alloy," as used herein, is meant an alloy lacking a definite ordered structure prior to a heat treatment that induces crystallization.

By "amorphous/microcrystalline metal alloy," as used herein, is meant an amorphous metal alloy subjected to a heat treatment that induces ferrite iron crystallization but does not induce system alloy crystallization. The Fe of an amorphous/microcrystalline metal alloy of the present invention is described as a bcc Fe solid solution in an amorphous mixture. No distinction is meant by the words "nanocrystalline" or "microcrystalline" as used herein to refer to the crystal state of ferrite.

By "$T_{C\ ALLOY}$," as used herein, is meant the temperature at which the whole system of an amorphous metal alloy forms crystals, including metalloid elements.

By "$T_{C\ FERRITE}$," as used herein, is meant the temperature at which the ferrite iron of an amorphous metal alloy will nucleate to form nano- or microcrystals.

By "a period of time sufficient to condition the alloy," as used herein, is meant a length of time of heating so as to precipitate or crystallize the ferrite but not to crystallize the complete system of an amorphous metal alloy.

"Saturation induction," as used herein, refers to the maximum amount of intrinsic induction (flux density) that an alloy will acquire when subjected to an applied field. Alloys of the present invention have a saturation induction of greater than about 9000 gauss or 0.9 tesla, preferably greater than about 10,000 gauss or 1.0 tesla, and more preferably, greater than about 11,000 gauss or 1.1 tesla. High saturation induction is desirable because less alloy would be needed in a transformer core, for example. Alloys of the present invention are not expected to have a saturation induction of greater than 1.5 tesla. Saturation induction of amorphous metal alloys is generally not as high as for microcrystalline materials.

By "coercivity," as used herein, is meant the field needed to demagnetize material that has become "a permanent magnet". Alloys of the present invention have a coercivity of less than about 0.10 oersted, preferably less than about 0.05 oersted. Alloys of the present invention are not expected to have a coercivity lower than about 0.01.

By "normal permeability ($\mu_n$)," as used herein, is meant the ratio of magnetic induction B to the corresponding d-c magnetic field strength, H, producing magnetic flux under SCM conditions. Normal permeability may be described as responsiveness to an applied field. Maximum permeability ($\mu_{max}$) is the largest value of normal permeability obtained by varying the amplitude of an applied magnetic field. Alloys of the present invention have a maximum permeability of greater than about 20,000, and preferably, greater than about 22,000, and most preferably, greater than about 24,000. Maximum permeability of alloys of the present invention are not expected to exceed about 100,000–120,000.

Not wanting to be bound by theory, it is thought that metals and elements, and amounts thereof, of the alloys of the present invention provide different characteristics to the amorphous metal alloy or to the amorphous/microcrystalline metal alloy of the present invention. For example, the amount of iron affects the strength of the magnetic properties, the amount of chromium, vanadium, phosphorus, and molybdenum or tungsten affects the growth rate of ferrite crystals. Chromium and vanadium tend to increase the strength and corrosion resistance of the alloy. Silicon assists permeability and helps to form nanocrystals that are more magnetic. When the amount of silicon is too low, the saturation induction will be too low, and if the amount of silicon is too high, it replaces desirable levels of carbon or phosphorus. The amount of carbon affects castability, while the amount of carbon and phosphorus affect the ability to quench (i.e., cool rapidly) the molten material to the amorphous state. The amount of copper or nickel affects the extent of nucleation of crystals, thereby affecting the fineness and number of crystals. In the heating step where the amorphous metal alloy is converted to an amorphous/microcrystalline metal alloy, it is thought that Fe-rich regions and Cu- or Ni-rich regions are formed because Cu and Fe tend to segregate. Fe-rich regions become the nuclei for bcc Fe solid solution which are selectively crystallized. The Cu- or Ni-rich regions around bcc Fe grains are difficult to crystallize because bcc Fe grains cannot grow in the region. Other Fe-rich regions are preferentially crystallized, as a result, the grain size becomes very small.

A finely controlled heat treatment is used to precipitate ultra small crystals of ferrite iron in an amorphous metal alloy. The amorphous metal alloy has two distinct crystallization temperatures with sufficient difference between the two crystallization temperatures so as to make a precise heat treatment feasible. The lower temperature is the temperature at which ferrite iron microcrystals nucleate and the higher temperature is where the phosphides, borides, or carbides form crystals or grains. Such ferrite crystals are typically $2\text{-}50\times10^{-9}$ meters in diameter. The temperature range at which the fine, ferrite crystals form is less than the general crystallization temperature of the material matrix. The difference must be sufficiently large so that during heat treatment the microcrystals do not grow too rapidly. Carefully controlled alloying and heat treatment within the temperature region defined by those crystallization temperatures is necessary to precipitate sufficient ferrite iron without causing the overall material to become too brittle for intended applications. Typically, the heat treatment temperature should not be higher than the crystallization temperature, $T_c$ for the alloy, but can be higher than the crystallization temperature for ferrite. Both of these values can be determined using differential calorimetry.

The magnetic properties of the alloy can be enhanced by heat-treating in conjunction with an applied magnetic field that is oriented in a preferred direction along the length of the material during the heat treatment. This results in reducing residual magnetism and coercivity, on the one hand, and in increasing both the permeability and the overall potential magnetic flux density, (i.e. saturation induction) on the other hand.

A process of producing an amorphous metal alloy of the present invention using substantially pure materials is another embodiment of the present invention. The process comprises melting a substantially pure source of iron, phosphorus, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_h$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent; treating the molten alloy to a separation step to remove insoluble slag formed in the molten alloy, and rapidly cooling the molten alloy to convert the molten alloy into an amorphous metal alloy. In a particularly preferred embodiment, the amorphous metal alloy is heat-treated at a temperature between $T_{C\ ALLOY}$ and $T_{C\ FERRITE}$ for a period of time sufficient to condition the alloy to form an amorphous/microcrystalline metal alloy. Preferably, a is about 74 to about 80, b is about 0.5 to about 3.0, c is about 0.5 to about 3.0, d is about 9.0 to about 12.0, and preferably h is about 0.1 to about 0.9 atomic percent.

A further aspect of the invention is a process of producing an amorphous/microcrystalline metal alloy using ferrophosphorus produced in a phosphorus-producing electric furnace, the process comprising melting the ferrophosphorus with a source of iron, carbon, silicon, copper or nickel or mixtures thereof, boron, and molybdenum or tungsten or mixtures thereof, to form a molten alloy comprising the elements and atomic percentages expressed by the formula $Fe_aCr_bV_cP_dSi_eC_fM_gX_h B_i$ wherein M is selected from is select p consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, i is about 0.1 to about 4.0 atomic percent, and a, b, c, d, e, f, g, h, and i total is nominally equal to 100 atomic percent; treating the molten alloy to a separation step to remove insoluble slag formed in the molten alloy, rapidly cooling the molten alloy to convert the molten alloy into an amorphous metal alloy. In a particularly preferred embodiment, the above-described amorphous metal alloy containing boron is heat-treated at a temperature between $T_{C\ ALLOY}$ and $T_{C\ FERRITE}$ for a period of time sufficient to condition the alloy to form an amorphous/microcrystalline metal alloy.

Another aspect of the invention is a process of producing an amorphous metal alloy using ferrophosphorus produced in a phosphorus-producing electric furnace, the process comprising melting a mixture of the ferrophosphorus with a source of iron, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_h Ti_j$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, j is up to about 0.5 atomic percent, and a, b, c, d, e, f, g, h and j total is nominally equal to 100 atomic percent; treating the molten alloy to a separation step to remove insoluble slag formed in the molten alloy, and rapidly cooling the molten alloy to convert the molten alloy into an amorphous metal alloy. In a further embodiment, this amorphous metal alloy is further heat-treated as described herein to form an amorphous/microcrystalline metal alloy.

Preferably, the amorphous metal alloy or the amorphous/microcrystalline metal alloy of the present invention is in the form of a strip, ribbon, or wire having a thickness of at least about 25 microns, and up to about 35 microns.

The separation step of the process of the present invention may be carried out by allowing the molten alloy to settle under quiescent conditions for a time sufficient for insoluble slag to rise, and then separating the slag and the alloy. The separation step may be carried out by bubbling an inert gas into the molten alloy, and removing slag, an alternative separation step is carried out by hot filtration of the molten alloy, thereby filtering out slag. The liquid alloy is cooled at a rate of $10^6$ degrees C./sec or greater to form an amorphous metal alloy.

The ferrophosphorus amorphous metal alloy so produced has two distinct crystallization temperatures: one for ferrite, the other for the alloy as a whole. Differential scanning calorimetry is used to determine the two crystallization temperatures. The amorphous metal alloy is heat treated at a temperature intermediate between those two crystallization temperatures for a time sufficient to form nanocrystalline ferrite within the alloy, i.e., the heat-treating of the amorphous metal alloy of the process of the present invention is at a temperature between $T_{C\ ALLOY}$ and $T_{C\ FERRITE}$ for a period of time sufficient to condition the alloy. The heat-treating may be carried out in a vacuum or in an inert atmosphere and may be carried out by induction heating, laser heating, contact heating over a heated solid surface, or by immersion in a thermal fluid.

A process of producing an amorphous or amorphous/microcrystalline metal alloy of the present invention using ferrophosphorus obtained as a by-product from the manufacture of phosphorus in electric furnaces is as follows. One such by-product is sold by FMC Corporation under the tradename FERROPHOS® iron phosphide (hereinafter, "ferrophos"). A typical ferrophos composition produced from a Western United States phosphate ore is : Fe (56–60 wt. %), P (24.5–27.8 wt. %), V(3.9–5.5 wt. %), Cr (3.6–6.0 wt. %) and Si (0.5–4.5 wt. %). Other metals are also found in the ferrophosphorus, usually in amounts no greater than about 1 atomic percent. In the operation of electric furnaces, a firnace "burden" or feed is made up of calcined ore, coke, silica, and phosphate ores containing residual oxides of iron, chromium, vanadium, titanium, and silicon. The ore is initially calcined to remove volatiles before it is added to the electric furnace in order to avoid volatiles interfering with proper furnace operation.

Electrodes within the electric furnace supply sufficient power to melt the burden and convert the phosphate ore to elemental phosphorus. This elemental phosphorus along with carbon monoxide produced in the furnace reaction is then removed as a gas stream from which the phosphorus is selectively condensed and recovered. At the base of the electric furnace, a molten mass remains which can be classified as two distinct types of residue. The upper layer of the molten mass is termed the “slag” layer that contains impurities of relatively low density that rise to the top of the molten mass. Large quantities of this slag form rather quickly and are removed from a taphole in the side of the furnace which is termed the “slag taphole”. Slag taps are required rather frequently, for example, starting about 20 minutes after the previous step is completed because of the rather rapid rate at which the slag accumulates.

Below this upper layer of slag is a much more dense ferrophosphorus layer which accumulates at a much slower rate than the slag. This crude ferrophosphorus is tapped from the furnace through a taphole which is below that of the slag tap and is termed “ferrophosphorus taphole”. Since the ferrophosphorus accumulates at a much slower rate than the slag, it is tapped from the furnace at much less frequent intervals, e.g., two or three times a day. Both the ferrophosphorus and the slag layers are tapped from the electric furnace in a molten condition and sent to various locations where they are chilled to form solids that can be readily handled for disposal and the like. When tapping the ferrophosphorus layer and the slag layer, the separation between them is not a sharp one and, therefore, the ferrophosphorus contains substantial amounts of slag impurities. In this form, the ferrophosphorus containing substantial amounts of slag, termed “ferrophosphorus slag” (because it contains both ferrophosphorus and substantial amounts of slag), cannot be used in the manufacture of amorphous or amorphous/microcrystalline metal alloys of the present invention because the slag components, which are essentially non-metallic impurities, oxides, scum and residue from the ore and furnace operation, interfere with the proper manufacture of an amorphous or an amorphous/microcrystalline metal alloy having the magnetic properties desired for the applications described herein. For example, the presence of the slag may cause weak spots in the alloy and deleteriously affect magnetic properties.

Alloying elements may be added to the electric firnace at any time to form a molten alloy for tapping and separation of slag, or may be added in a molten state to purified molten ferrophosphorus.

The ferrophosphorus slag or ferrophosphorus alloy slag is treated to a separation step in order to purify the material sufficiently so that it can be used to make the amorphous or amorphous/microcrystalline metal alloys having acceptable properties for their intended uses. In carrying out this separation step, the ferrophosphorus slag or alloy slag must be in a molten state. While it is possible to melt solid ferrophosphorus in a suitable furnace so that the appropriate separation step can be carried out, it is preferable to treat the molten ferrophosphorus slag as it is tapped from the furnace in order to conserve heat and power. This can be done by placing the molten ferrophosphorus slag in a suitable ladle or container, which may be equipped with a heating source to prevent the molten mass from solidifying. If the ladle or container is sufficiently insulated, the ferrophosphorus slag or alloy slag will frequently form a thin, hard crust at the point where it is in contact with any air or a non-heated surface, but the interior will remain molten. The separation of the slag can be achieved in a number of ways. Initially, the separation can take place by allowing the ferrophosphorus slag or alloy slag to remain quiescent and in a molten state for a sufficient time, usually up to about an hour. The ferrophosphorus metal or alloy is much more dense than the slag and, therefore, tends to fall to the bottom of the molten mass while the slag naturally rises to the surface of the molten mass. By allowing the ferrophosphorus slag or alloy slag to remain quiescent while in a molten state, whether in a ladle or insulated container, a natural separation of the slag takes place. After the molten slag has been allowed to remain quiescent for a sufficient time, the bottom portion, the ferrophosphorus portion or ferrophosphous alloy, is tapped off into an insulated container, substantially free of slag which has risen to the top of the molten mass.

A second means of carrying out the separation step of the slag is to bubble an inert gas such as argon through the molten mass. The argon is preferably preheated to avoid having any chilling effect on the molten metal and the flow of argon through the molten mass accelerates the rise of the slag to the top of the melt while allowing the ferrophosphorus or alloy to settle to the bottom. This method is faster than the settling method described above but it does require additional equipment and an inert gas source to operate in this fashion.

Another method for treating the slag to a separation step is to subject the molten slag to filtration. The high temperature of the slag dictates the use of a filter that is able to withstand such high temperatures without deteriorating. One such type of filter is made of ceramic materials resistant to these high temperatures. In order to successfully filter the slag, the filter must be kept hot such that the molten slag does not have a chance to cool and solidify in the filter holes. Further, the molten slag must contain relatively small amounts of slag so that the holes in the filter are not plugged by the slag and hinder the flow of the ferrophosphorus or alloy through the filter.

Irrespective of how the separation step is carried out, the separation step results in the recovery of a purified molten ferrophosphorus or ferrophosphorus alloy whose slag content has been reduced to acceptable levels.

In the case of adding alloying elements to the purified molten ferrophosphorus, the addition often causes impurities to rise to the surface and form a floating slag film on top of the molten alloy. It is not known whether this film is caused by impurities in the ferrophosphorus, or alloying metals being rendered insoluble in the molten alloy by the added elements, or whether the molten elements cause such residual impurities to coalesce. In any event, the floating slag film is skimmed off of the molten alloy or otherwise separated from the molten alloy, e.g., by filtration, quiescent separation, or inert gas injection before the alloy is converted to an amorphous metal alloy product or an amorphous/microcrystalline metal alloy product. Where separation by filtration is desired, it is desirable to have the molten alloy at or near a eutectic composition, such that its melting point is lower than either the ferrophosphorus or the alloying element. This permits filtration to be carried out at a much lower temperature than either the melting point of ferrophosphorus or of alloying elements and therefore facilitates a filtration step. Separation of slag may occur prior to, or after addition of alloying elements, or may occur at both times.

The resulting molten alloy is then rapidly cooled to below its vitrification temperature such as by pouring a continuous stream of the molten alloy onto a moving cold surface such as a rotating metal wheel, rollers or belt. In normal practice, an amorphous alloy metal is recovered as a thin ribbon or thin wire from the rotating wheel, rollers or belt. The ribbon or wire must be relatively thin since it all must be quenched at the high cooling rate required for producing the amorphous metal alloys.

If ferrophosphorus from phosphorus production is used, a preferred process of preparing an amorphous alloy includes the steps of preparing a molten mix of the ferrophosphorus with a source of each of iron, silicon, carbon, copper or nickel or mixtures thereof, and molybdenum or tungsten or mixtures thereof; treating said molten alloy to a separation step to remove insoluble slag from the molten alloy; and rapidly cooling the molten alloy to below the vitrification temperature of the molten alloy to convert it into a solid amorphous metal alloy.

A process of preparing an amorphous/microcrystalline metal alloy from the above described amorphous metal alloy includes the step of heat-treating the amorphous alloy at temperatures and for times so as to precipitate microcrystals of ferrite iron up to a significant percentage of the entire bulk material. Precipitation of microcrystals is influenced by the presence of a nucleation agent such as copper or nickel or mixtures thereof in necessary amounts so as to form molecular clusters that act as nucleation sites for the formation of ferrite iron crystals. Presence of molybdenum or tungsten or mixtures thereof controls growth rate of crystals. The iron crystals contain small amounts of silicon and less carbon and phosphorus. The heat treatment is controlled to make ultrafine crystals. The crystals are ultrafine, $2\text{-}50\times10^{-9}$ meters in diameter, so that the general matrix that is left amorphous has a generally uniform chemistry.

Heat treatment of the amorphous alloy is best performed at a temperature above the $T_c$ for ferrite, but below the $T_c$ for the system. For the systems in question, such heat treatment preferably occurs within the temperature range from about 360° C. to about 530° C., depending upon the alloy composition, in an inert atmosphere or under a thermal transfer fluid. Generally, as the heat treatment temperature increases, the heat treatment time period decreases. The difference in temperature between the temperature at which the ferrite iron nanocrystals form (i.e. $T_{C\ FERRITE}$) and the temperature at which the remainder of the matrix crystallizes ($T_{c\ MATRIX}$) is preferably large. A difference of at least 70° C. provides satisfactory results, but a smaller difference can work. The heat-treated alloy exhibits enhanced magnetic properties and is sufficiently mechanically ductile to be fabricated into various devices such as transformer cores.

Even though the invention has been described with a certain degree of particularity, it is evident that many alternatives, modifications, and variations will be apparent to those skilled in the art in light of the foregoing disclosure. Accordingly, it is intended that all such alternatives, modifications, and variations which fall within the spirit and the scope of the invention be embraced by the defined claims.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All parts and percentages in the examples, and throughout this specification and claims, are atomic percent and all temperatures are in degrees centigrade, unless otherwise indicated. In the claims, the addition of an element to the alloy can be as the pure element or as part of a composition, whether pure or impure.

EXAMPLE 1

Ferrophos, iron, carbon, copper, silicon and molybdenum were melted together to form a mixture, which was then rapidly solidified onto a single rotating chill block that reduced the temperature at a rate of approximately $10^6$ °C./second to make an amorphous alloy strip 0.27 inches wide and 0.0012 inches thick (about 30 microns). The alloy has the nominal atomic chemical formula:

$$Fe_{77.3}Ti_{0.4}Cr_{1.3}V_{1.5}P_{11}Si_{1.5}C_6Cu_{0.5}Mo_{0.5}$$

According to differential scanning calorimetry data for this alloy, ferrite precipitation starts at $T_c$ 416° C., while general crystallization of the material starts at 502° C. Based on that data, the alloy was subjected to rapid heat treatment using a carbon dioxide laser in order to heat the ribbon to a temperature between 416° C. and 502° C. No magnetic field was applied to the ribbon during heat treatment. After the alloy had cooled to ambient temperature, the magnetic properties of the material were measured using a vibrating sample magnetometer. The maximum permeability ($\mu_{max}$) was measured as 25,000, and the saturation induction was 1.22 tesla (12200 gauss). The coercivity was 0.04 oersted.

EXAMPLE 2

Ferrophos, iron, carbon, copper, silicon, boron, and molybdenum were melted together and then rapidly solidified onto a single rotating chill block to make an amorphous alloy strip 0.27 inches wide and 0.0011 inches thick (about 30 microns). The nominal atomic chemical formula of the alloy material is:

$$Fe_{77.3}Ti_{0.4}Cr_{1.3}V_{1.5}P_{11}B_2Si_{1.5}C_4Cu_{0.5}Mo_{0.5}$$

Using differential scanning calorimetry data, a determination was made that ferrite precipitation starts at 432° C., while general crystallization of the material starts at 518° C. for this alloy. The alloy strip was then heat-treated at a temperature within the range of 432–518° C., after which it was permitted to cool to ambient temperature. The magnetic properties of the resulting heat-treated ribbon were measured with a vibrating sample magnetometer. Under a very high applied field of over 1200 oersted, the resulting magnetic saturation induction was about 1.27 tesla (12700 gauss). Maximum permeability ($\mu_{max}$) was over 26,000.

EXAMPLE 3

Ferrophos, iron, carbon, copper, silicon, boron, and molybdenum were melted together and then rapidly solidified onto a single rotating chill block to make an amorphous alloy strip. The nominal atomic chemical formula of the material is:

$$Fe_{78.4}Ti_{0.3}Cr_{0.8}V_{1.0}P_7B_4Si_{1.5}C_6Cu_{0.5}Mo_{0.5}$$

Differential scanning calorimetry data shows that ferrite precipitation starts at 446° C. and the general crystallization of the material starts at 528° C. The magnetic properties of the resulting heat-treated ribbon were measured with a vibrating sample magnetometer. Under a very high applied field of over 1200 oersteds, the resulting magnetic saturation induction was about 1.23 tesla (12300 gauss). Maximum permeability ($\mu_{max}$) was over 26,000.

EXAMPLE 4

Using the procedure of the previous examples, an amorphous ribbon was prepared having the nominal formula:

$$Fe_{76}Cr_2V_2Ti_{0.5}P_{11}Si_{1.5}C_6Mo_{0.5}CU_{0.5}.$$

The alloy strip was then heat-treated at a temperature between the ferrite precipitation temperature and the general crystallization temperature, after which it was permitted to cool to ambient temperature. The magnetic properties of the ribbon before and after heat treatment were measured with a B-H loop instrument. As shown in Table 1 of Example 7, the maximum permeability ($\mu_{max}$) was measured as 25,000 and 32,000; the saturation induction was 1.05 tesla and 1.17 tesla; and the coercivity was 0.09 oersted and 0.04 oersted; each set of measurements made before and after heat treatment, respectively.

EXAMPLE 5

Ferrophos, iron, carbon, copper, silicon and tungsten were melted together and then rapidly solidified onto a single rotating copper chill block under an argon atmosphere to make an amorphous alloy strip. In this example tungsten replaces molybdenum used in Example 1. The nominal atomic chemical formula of the resulting material is:

$$Fe_{77.3}Ti_{0.4}Cr_{1.3}V_{1.5}P_{11}Si_{1.5}C_6CU_{0.5}W_{0.5}.$$

The ribbon was then heated to 475° C. for one minute in an induction vacuum furnace with no magnetic field applied and then cooled to ambient under vacuum. Using B-H loop instrumentation, the measured magnetic properties of the resulting heat treated ribbon were: coercivity =0.09 oersted and maximum permeability, $\|_{max}$=24,000. At an applied field of H=1.0 oersted, the saturation induction was 1.10 tesla (11000 gauss).

EXAMPLE 6

Ferrophos, iron, carbon, copper, silicon and molybdenum were melted together and then rapidly solidified onto a single rotating copper chill block under an argon atmosphere to make an amorphous alloy strip. In this example, carbon was reduced from 6 atomic percent in the previous examples to 5 atomic percent. The atomic chemical formula of the material is:

$$Fe_{78.3}Ti_{0.4}Cr_{1.3}V_{1.5}P_{11}Si_{1.5}C_5CU_{0.5}Mo_{0.5}.$$

The ribbon was then heated to 475° C. for one minute in an induction vacuum furnace with no magnetic field applied and then cooled to ambient under vacuum. Using B-H loop instrumentation, the measured magnetic properties of the resulting heat treated ribbon were coercivity =0.06 oersted and maximum permeability, $\mu_{max}$ =26,000. At an applied field of H=1.0 oersted, the saturation induction was 1.15 tesla (11500 gauss).

EXAMPLE 7

For comparison of magnetic properties between alloys of the present Examples 1–6 and a prior art alloy, an alloy ribbon was prepared from ferrophosphorus and sufficient iron to produce an amorphous metal having the nominal chemical formula $Fe_{77}Cr_2V_2P_{19}$ as set forth in U.S. Pat. Nos. 5,518,518 and 5,547,487. Table 1 provides a comparison of magnetic properties for this prior art alloy and the alloys of Examples 1–6 of the present application.

TABLE 1

Comparison of Magnetic Properties

| Parameter | Alloy of '518 and '487 patents | Example 1[a] | Example 2[a] | Example 3[a] | Example 4 alloy before heat treatment[b] | Example 4 alloy after heat treatment[b] | Example 5[b] | Example 6[b] |
|---|---|---|---|---|---|---|---|---|
| Tensile Strength, MPA | 1240 | | | | 1820 | 2240 | | |
| Permeability | $\mu_n$ = 9000 | $\mu_{max}$ = 25,000 | $\mu_{max}$ = 26,000 | $\mu_{max}$ = 26,000 | $\mu_{max}$ = 25000 | $\mu_{max}$ = 32,000 | $\mu_{max}$ = 24,000 | $\mu_{max}$ = 26,000 |
| Saturation Induction, tesla | 0.90 | 1.22 | 1.27 | 1.23 | 1.05 | 1.17 | 1.10 | 1.15 |
| Electrical Resistivity, $\mu$ ohm-cm | 230 | | | | 180 | 196 | | |
| Coercivity, oersted | 0.10 | 0.04 | | | 0.09 | 0.04 | 0.09 | 0.06 |
| Glass Transition Temperature, ° C. | 454 | | | | 420 (Ferrite) 510 (Matrix) | 420 (Ferrite) 510 (Matrix) | | |

[a]using a vibrating sample magnetometer for measurement
[b]using a B-H loop instrument for measurement

EXAMPLE 8

Further amorphous metal alloy ribbons from ferrophosphorus produced in a phosphorus-producing electric furnace, a ribbon from "pure ferrophosphorus," and a ribbon from a mixture of "pure ferrophosphorus" and ferrophosphorus as set forth in U.S. Pat. Nos. 5,518,518 and 5,547,487 were studied. "Pure ferrophosphorus" means iron phosphide (99.5%) and was obtained from ALFA® AESAR® (#22951-PF, Ward Hill, Mass.). The compositions are provided in Table 2.

TABLE 2

Chemical Composition of Amorphous Ribbons Made with Ferrophos (at %)

| | Fe | Cr | V | P | Ti | Si | C | Mo | Cu | W |
|---|---|---|---|---|---|---|---|---|---|---|
| a | 76 | 2 | 2 | 11 | 0.5 | 1.5 | 6 | 0.5 | 0.5 | — |
| b | 76.25 | 2 | 2 | 11 | 0.5 | 1.5 | 6 | 0.25 | 0.5 | — |
| c | 75.5 | 2 | 2 | 11 | 0.5 | 1.5 | 6 | 1.0 | 0.5 | — |
| d | 76 | 2 | 2 | 11 | 0.5 | 1.5 | 6 | — | 0.5 | 0.5 |
| e | 75.5 | 2 | 2 | 11 | 0.5 | 1.5 | 6 | — | 0.5 | 1.0 |
| f | 77 | 2 | 2 | 11 | 0.5 | 1.5 | 5 | 0.5 | 0.5 | — |
| g | 75 | 2 | 2 | 11 | 0.5 | 1.5 | 7 | 0.5 | 0.5 | — |

TABLE 2-continued

| Chemical Composition of Amorphous Ribbons Made with Ferrophos (at %) | | | | | | | | | | |
|---|---|---|---|---|---|---|---|---|---|---|
| | Fe | Cr | V | P | Ti | Si | C | Mo | Cu | W |
| h | 76.5 | 2 | 2 | 11 | 0.5 | 1.0 | 6 | 0.5 | 0.5 | — |
| i | 75.5 | 2 | 2 | 11 | 0.5 | 2.0 | 6 | 0.5 | 0.5 | — |
| j[1] | 80.5 | — | — | 11 | — | 1.5 | 6 | 0.5 | 0.5 | — |
| k[2] | 78.25 | 1.0 | 1.0 | 11 | 0.25 | 1.5 | 6 | 0.5 | 0.5 | — |
| l | 74.5 | 2.5 | 2.5 | 11 | 1.0 | 1.5 | 6 | 0.5 | 0.5 | — |

[1] "pure ferrophosphorus"
[2] "mixture of "pure ferrophosphorus" and ferrophos as set forth in the '518 and '487 patents Magnetic properties of amorphous ribbons of Table 2 before heat treatment are provided in Table 3.

TABLE 3

| Magnetic Properties of Amorphous Ribbons Before Heat Treatment | | | | |
|---|---|---|---|---|
| | $\mu_i$[1.] | $\mu_{max}$[2.] | $B_s$,tesla[3.] | $H_c$,oersted[4.] |
| a | $1.2 \cdot 10^4$ | $2.5 \cdot 10^4$ | 1.03 | 0.18 |
| b | $1.2 \cdot 10^4$ | $2.4 \cdot 10^4$ | 1.01 | 0.19 |
| c | $1.2 \cdot 10^4$ | $2.5 \cdot 10^4$ | 1.02 | 0.18 |
| d | $1.2 \cdot 10^4$ | $2.4 \cdot 10^4$ | 1.02 | 0.19 |
| e | $1.2 \cdot 10^4$ | $2.4 \cdot 10^4$ | 1.02 | 0.20 |
| f | $1.25 \cdot 10^4$ | $2.6 \cdot 10^4$ | 1.03 | 0.18 |
| g | $1.15 \cdot 10^4$ | $2.5 \cdot 10^4$ | 1.02 | 0.19 |
| h | $1.2 \cdot 10^4$ | $2.5 \cdot 10^4$ | 1.03 | 0.18 |
| i | $1.2 \cdot 10^4$ | $2.5 \cdot 10^4$ | 1.02 | 0.18 |
| j | $1.3 \cdot 10^4$ | $2.7 \cdot 10^4$ | 1.03 | 0.18 |
| k | $1.2 \cdot 10^4$ | $2.5 \cdot 10^4$ | 1.03 | 0.18 |
| l | — | — | — | — |

[1.] initial permeability
[2.] maximum permeability
[3.] saturation induction
[4.] coercivity The magnetic properties of ribbons, including permeability, hysteresis loop, induction and coercivity, were found to be essentially the same for amorphous ribbons of compositions a–k before heat treatment. Magnetic properties of composition 1 were not able to be measured.

Nanocrystals form in ribbons after heat treatment, i.e., annealing at 475° C. for 1 min in a vacuum furnace, and the magnetic properties improve compared to that for ribbons before heat treatment. Magnetic properties of mixed amorphous/crystalline alloys are provided in Table 4. Although annealing of the ribbon of composition 1 was carried out, magnetic properties were not able to be measured.

TABLE 4

| Magnetic Properties of Mixed Amorphous/Microcrystalline Ribbons After Heat Treatment[1] | | | | |
|---|---|---|---|---|
| | $\mu_i$[2.] | $\mu_{max}$[3.] | $B_s$,tesla[4.] | $H_c$,oersted[5.] |
| a | $1.5 \cdot 10^4$ | $3.2 \cdot 10^4$ | 1.1 | 0.07 |
| b | $1.5 \cdot 10^4$ | $3.1 \cdot 10^4$ | 1.1 | 0.09 |
| c | $1.5 \cdot 10^4$ | $3.2 \cdot 10^4$ | 1.1 | 0.08 |
| d | $1.5 \cdot 10^4$ | $3.1 \cdot 10^4$ | 1.1 | 0.09 |
| e | $1.5 \cdot 10^4$ | $3.0 \cdot 10^4$ | 1.1 | 0.09 |
| f | $1.6 \cdot 10^4$ | $3.3 \cdot 10^4$ | 1.15 | 0.06 |
| g | $1.4 \cdot 10^4$ | $3.1 \cdot 10^4$ | 1.05 | 0.07 |
| h | $1.5 \cdot 10^4$ | $3.2 \cdot 10^4$ | 1.1 | 0.08 |
| i | $1.5 \cdot 10^4$ | $3.2 \cdot 10^4$ | 1.1 | 0.07 |
| j | $1.8 \cdot 10^4$ | $3.6 \cdot 10^4$ | 1.15 | 0.06 |
| k | $1.7 \cdot 10^4$ | $3.5 \cdot 10^4$ | 1.15 | 0.06 |

TABLE 4-continued

| Magnetic Properties of Mixed Amorphous/Microcrystalline Ribbons After Heat Treatment[1] | | | | |
|---|---|---|---|---|
| | $\mu_i$[2.] | $\mu_{max}$[3.] | $B_s$,tesla[4.] | $H_c$,oersted[5.] |
| l | — | — | — | — |

[1] annealing 475° C., 1 min
[2.] initial permeability
[3.] maximum permeability
[4.] saturation induction
[5.] coercivity With the exception of composition 1, fluctuations of chemical composition and replacement of molybdenum with tungsten did not adversely affect magnetic properties of these alloys.

All of the compositions and methods disclosed and claimed herein can be made and executed without undue experimentation in light of the present disclosure. While the compositions and methods of this invention have been described in terms of preferred embodiments, it will be apparent to those of skill in the art that variations may be applied to the composition, methods and in the steps or in the sequence of steps of the method described herein without departing from the concept, spirit and scope of the invention. More specifically, it will be apparent that certain agents which are both chemically and structurally related may be substituted for the agents described herein while the same or similar results would be achieved. All such similar substitutes and modifications apparent to those skilled in the art are deemed to be within the spirit, scope and concept of the invention as defined by the appended claims.

What is claimed:

1. An amorphous metal alloy comprising $Fe_aCr_bV_cP_dSi_eC_fM_gX_h$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent.

2. The amorphous metal alloy of claim 1 wherein a is about 74 to about 80 atomic percent, b is about 0.5 to about 3.0 atomic percent, c is about 0.5 to about 3.0 atomic percent, d is about 9.0 to about 12.0 atomic percent, and h is about 0.1 to about 0.9 atomic percent.

3. The amorphous metal alloy of claim 1 or 2 further comprising boron at about 0.1 to about 4.0 atomic percent and a, b, c, d, e, f, g, h, and boron total in nominally equal to 100 atomic percent.

4. An amorphous/microcrystalline metal alloy formed by heat-treating the amorphous metal alloy of claim 1 or 2 at a temperature between $T_{C\ ALLOY}$ and $T_{C\ FERRITE}$ for a period of time sufficient to condition the alloy.

5. An amorphous/microcrystalline metal alloy formed by heat-treating the amorphous metal alloy of claim 3 at a temperature between $T_{C\ ALLOY}$ and $T_{C\ FERRITE}$ for a period of time sufficient to condition the alloy.

6. The amorphous metal alloy of claim 1 or 2 in the form of a wire, ribbon, or strip having a thickness of up to about 35 microns.

7. The amorphous metal alloy of claim 1 or 2 in the form of a wire, ribbon, or strip having a thickness of at least 25 microns.

8. The amorphous metal alloy of claim 3 in the form of a wire, ribbon, or strip having a thickness of up to about 35 microns.

9. The amorphous metal alloy of claim 3 in the form of a wire, ribbon, or strip having a thickness of at least 25 microns.

10. The amorphous metal alloy of claim 1 or 2 having a saturation induction greater than 0.9 tesla, a coercivity less than 0.1 oersted, and a maximum permeability of greater than 20,000.

11. The amorphous metal alloy of claim 3 having a saturation induction greater than 0.9 tesla, a coercivity less than 0.1 oersted, and a maximum permeability of greater than 20,000.

12. The amorphous/microcrystalline metal alloy of claim 4 having a saturation induction greater than 0.9 tesla, a coercivity less than 0.1 oersted, and a maximum permeability of greater than 20,000.

13. The amorphous/microcrystalline metal alloy of claim 5 having a saturation induction greater than 0.9 tesla, a coercivity less than 0.1 oersted, and a maximum permeability of greater than 20,000.

14. A process of producing an amorphous metal alloy using ferrophosphorus produced in a phosphorus-producing electric furnace, the process comprising melting the ferrophosphorus with a source of iron, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_h$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent;

treating the molten alloy to a separation step to remove insoluble slag formed in the molten alloy, and rapidly cooling the molten alloy to convert the molten alloy into an amorphous metal alloy.

15. A process of producing an amorphous/microcrystalline metal alloy using ferrophosphorus produced in a phosphorus-producing electric furnace, the process comprising melting the ferrophosphorus with a source of iron, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_h$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, and a, b, c, d, e, f, g, and h total is nominally equal to 100 atomic percent;

treating the molten alloy to a separation step to remove insoluble slag formed in the molten alloy, rapidly cooling the molten alloy to convert the molten alloy into an amorphous metal alloy; and heat-treating the amorphous metal alloy at a temperature between $T_{C\ ALLOY}$ and $T_{C\ FERRITE}$ for a period of time sufficient to condition the alloy to form an amorphous/microcrystalline metal alloy.

16. The process of claim 14 or 15 wherein the separation step is carried out by allowing the molten alloy to settle under quiescent conditions for a time sufficient for insoluble slag to rise, and then separating the slag and the alloy.

17. The process of claim 14 or 15 wherein the separation step is carried out by bubbling an inert gas into the molten alloy, and removing slag.

18. The process of claim 14 or 15 wherein the separation step is carried out by hot filtration of the molten alloy, thereby filtering out slag.

19. The process of claim 14 or 15 wherein a is about 74 to about 80 atomic percent, b is about 0.5 to about 3.0 atomic percent, c is about 0.5 to about 3.0 atomic percent, d is about 9.0 to about 12.0 atomic percent, and h is about 0.1 to about 0.9 atomic percent.

20. A process of producing an amorphous metal alloy using ferrophosphorus produced in a phosphorus-producing electric furnace, the process comprising melting the ferrophosphorus with a source of iron, carbon, silicon, copper or nickel or mixtures thereof, boron, and molybdenum or tungsten or mixtures thereof, to form a molten alloy comprising the elements and atomic percentages expressed by the formula $Fe_aCr_bV_cP_dSi_eC_fM_gX_hB_i$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, i is about 0.1 to about 4.0 atomic percent, and a, b, c, d, e, f, g, h, and i total is nominally equal to 100 atomic percent;

treating the molten alloy to a separation step to remove insoluble slag formed in the molten alloy, and rapidly cooling the molten alloy to convert the molten alloy into an amorphous metal alloy.

21. The process of claim 20 further comprising heat-treating the amorphous metal alloy at a temperature between $T_{C\ ALLOY}$ and $T_{C\ FERRITE}$ for a period of time sufficient to condition the alloy to form an amorphous/microcrystalline metal alloy.

22. A process of producing an amorphous metal alloy using ferrophosphorus produced in a phosphorus-producing electric furnace, the process comprising melting a mixture of the ferrophosphorus with a source of iron, carbon, silicon, copper or nickel or mixtures thereof, and molybdenum or tungsten or mixtures thereof, to form a molten alloy comprising the elements and atomic percentages expressed by the formula $Fe_aCr_bV_cP_dSi_eC_fM_gX_hTi_j$ wherein M is selected from the group consisting of Cu, Ni, and mixtures thereof, X is selected from the group consisting of Mo, W, and mixtures thereof, a is about 66 to about 80 atomic percent, b is about 0.5 to about 5.0 atomic percent, c is about 0.5 to about 5.0 atomic percent, d is about 7.0 to about 13.0 atomic percent, e is about 0.2 to about 3.0 atomic percent, f is about 4.5 to about 8.0 atomic percent, g is about 0.1 to about 0.9 atomic percent, h is about 0.1 to about 3.0 atomic percent, j is up to about 0.5 atomic percent, and a, b, c, d, e, f, g, h and j total is nominally equal to 100 atomic percent;

treating the molten alloy to a separation step to remove insoluble slag formed in the molten alloy, and rapidly cooling the molten alloy to convert the molten alloy into an amorphous metal alloy.

23. The process of claim 22 further comprising heat-treating the amorphous metal alloy at a temperature between $T_{C\ ALLOY}$ and $T_{C\ FERMTE}$ for a period of time sufficient to condition the alloy to form an amorphous/microcrystalline metal alloy.

24. The process of claim 15, 21, or 23 wherein the heat-treating is carried out in a vacuum.

25. The process of claim 15, 21, or 23 wherein the heat-treating is carried out in an inert atmosphere.

26. The process of claim 24 wherein the heat-treating is carried out by induction heating, laser heating, or contact heating over a heated solid surface.

27. The process of claim 25 wherein the heat-treating is carried out by induction heating, laser heating, or contact heating over a heated solid surface.

28. The process of claim 24 wherein the heat-treating is carried out by immersion in a thermal fluid.

29. The process of claim 25 wherein the heat-treating is carried out by immersion in a thermal fluid.

30. The process of claim 14, 15, 20, 21, 22, or 23 wherein the metal alloy has a saturation induction greater than 0.9 tesla, a coercivity less than 0.1 oersted, and a maximum permeability of greater than 20,000.

31. An amorphous metal alloy or amorphous/microcrystalline metal alloy selected from the group consisting of $Fe_{77.3}Ti_{0.4}Cr_{1.3}V_{1.5}P_{11}Si_{1.5}C_6Cu_{0.5}Mo_{0.5}$, $Fe_{77.3}Ti_{0.4}Cr_{1.3}V_{1.5}P_{11}B_2Si_{1.5}C_4CU_{0.5}Mo_{0.5}$, $Fe_{78.4}Ti_{0.3}Cr_{0.8}V_{1.0}P_7B_4Si_{1.5}C_6Cu_{0.5}Mo_{0.5}$, $Fe_{76}Cr_2V_2Ti_{0.5}P_{11}Si_{1.5}C_6Mo_{0.5}Cu_{0.5}$, $Fe_{77.3}Ti_{0.4}Cr_{1.3}V_{1.5}P_{11}Si_{1.5}C_6Cu_{0.5}W_{0.5}$, and $Fe_{78.3}Ti_{0.4}Cr_{1.3}V_{1.5}P_{11}Si_{1.5}C_5Cu_{0.5}Mo_{0.5}$.

32. A transformer core comprising the amorphous/microcrystalline metal alloy of claim 4.

33. A transformer core comprising the amorphous/microcrystalline metal alloy of claim 5.

34. An article of manufacture comprising the amorphous/microcrystalline metal alloy of claim 4.

35. An article of manufacture comprising the amorphous/microcrystalline metal alloy of claim 5.

* * * * *

UNITED STATES PATENT AND TRADEMARK OFFICE

CERTIFICATE OF CORRECTION

PATENT NO. : 6,053,989

DATED : April 25, 2000

INVENTOR(S) : Michael Orillion; John Pfeiffer; Yulig K. Kovneristy

It is certified that error appears in the above-identified patent and that said Letters Patent are hereby corrected as shown below:

Column 7, line 26, the phrase "is selected p" should be replaced with the phrase, "the group".
Column 8, line 57, the word, "firnace" should be replaced with the word, "furnace".
Column 9, line 40, the word, "firnace" should be replaced with the word, "furnace".
Column 13, line 49, the expression, "$||_{max}$" should be replaced with the expression, "$\mu_{max}$".

Signed and Sealed this

Twenty-second Day of May, 2001

*Attest:*

NICHOLAS P. GODICI

*Attesting Officer* *Acting Director of the United States Patent and Trademark Office*